(12) United States Patent
Kim

(10) Patent No.: US 11,892,140 B2
(45) Date of Patent: Feb. 6, 2024

(54) VENTILATION CAP

(71) Applicant: AMOGREENTECH CO., LTD., Gimpo-si (KR)

(72) Inventor: Min Seok Kim, Hwaseong-si (KR)

(73) Assignee: AMOGREENTECH CO., LTD., Gimpo-si (KR)

(*) Notice: Subject to any disclaimer, the term of this patent is extended or adjusted under 35 U.S.C. 154(b) by 604 days.

(21) Appl. No.: 16/971,295

(22) PCT Filed: Feb. 13, 2019

(86) PCT No.: PCT/KR2019/001715
§ 371 (c)(1),
(2) Date: Aug. 19, 2020

(87) PCT Pub. No.: WO2019/164169
PCT Pub. Date: Aug. 29, 2019

(65) Prior Publication Data
US 2021/0010655 A1    Jan. 14, 2021

(30) Foreign Application Priority Data

Feb. 20, 2018  (KR) .................. 10-2018-0019969

(51) Int. Cl.
*B01D 46/16*   (2006.01)
*F21S 45/33*   (2018.01)
*B60Q 1/04*    (2006.01)

(52) U.S. Cl.
CPC .............. *F21S 45/33* (2018.01); *B01D 46/16* (2013.01); *B01D 2279/35* (2013.01); *B60Q 1/04* (2013.01)

(58) Field of Classification Search
None
See application file for complete search history.

(56) References Cited

U.S. PATENT DOCUMENTS

| | | | | |
|---|---|---|---|---|
| 6,994,621 | B2* | 2/2006 | Mashiko | H05K 5/0213 |
| | | | | 362/345 |
| 8,246,726 | B2* | 8/2012 | Yano | H05K 5/0213 |
| | | | | 454/367 |
| 8,814,993 | B2* | 8/2014 | Yano | H05K 5/0213 |
| | | | | 55/502 |
| 9,120,059 | B2* | 9/2015 | Daimon | H05K 5/0213 |
| 9,120,060 | B2* | 9/2015 | Uemura | B01D 69/10 |
| 9,121,626 | B2* | 9/2015 | Uemura | F24F 13/28 |

(Continued)

FOREIGN PATENT DOCUMENTS

KR  10-2010-0134092 A   12/2010
KR  10-2013-0022370 A    3/2013

(Continued)

*Primary Examiner* — Brit E. Anbacht
(74) *Attorney, Agent, or Firm* — Maschoff Brennan

(57) ABSTRACT

A ventilation cap according to the present disclosure includes a body, a ventilation filter, a cover member, and legs. A first vent hole is defined in the body, and the ventilation filter is disposed on the body to cover the first vent hole. The cover member is coupled to the body to cover the ventilation filter, and the legs are formed beneath the body and are spaced apart from each other around the first vent hole. Further, the legs are received in a hole defined in a target housing to be coupled to the target housing, and a second vent hole communicating with the first vent hole is defined in a side portion of the cover member.

13 Claims, 6 Drawing Sheets

(56) References Cited

U.S. PATENT DOCUMENTS

| | | | |
|---|---|---|---|
| 9,295,949 B2* | 3/2016 | Uemura | H02K 5/10 |
| 9,332,662 B2* | 5/2016 | Yano | H05K 5/0213 |
| 9,861,000 B2* | 1/2018 | Ishii | F21V 31/03 |
| 10,117,347 B2* | 10/2018 | Zaiki | H05K 5/0213 |
| 10,136,717 B2* | 11/2018 | Shuto | B65D 33/16 |
| 10,420,238 B2* | 9/2019 | Uemura | F21S 45/30 |
| 10,529,969 B2* | 1/2020 | Ogawa | B65D 79/005 |
| 2008/0041624 A1* | 2/2008 | Sasaki | H05K 5/0213 |
| | | | 174/520 |
| 2009/0047890 A1* | 2/2009 | Yano | F21S 45/30 |
| | | | 454/270 |
| 2011/0016836 A1* | 1/2011 | Yano | F21V 31/03 |
| | | | 55/491 |
| 2022/0314150 A1* | 10/2022 | Yano | B01D 46/543 |

FOREIGN PATENT DOCUMENTS

| | | |
|---|---|---|
| KR | 10-2013-0031049 A | 3/2013 |
| KR | 10-2014-0010332 A | 1/2014 |
| KR | 10-2014-0026518 A | 3/2014 |
| KR | 10-2016-0029455 A | 3/2016 |

* cited by examiner

[FIG. 1]
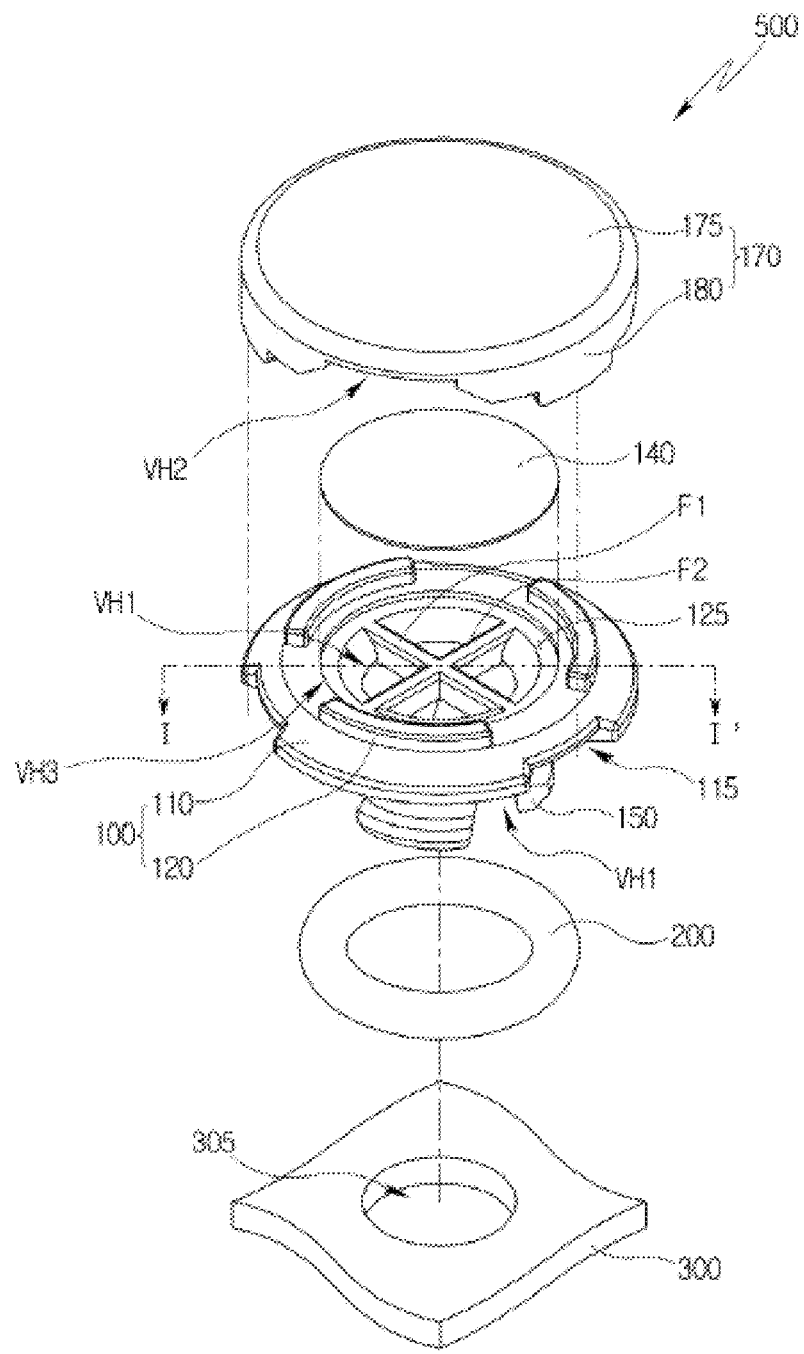

[FIG. 2]
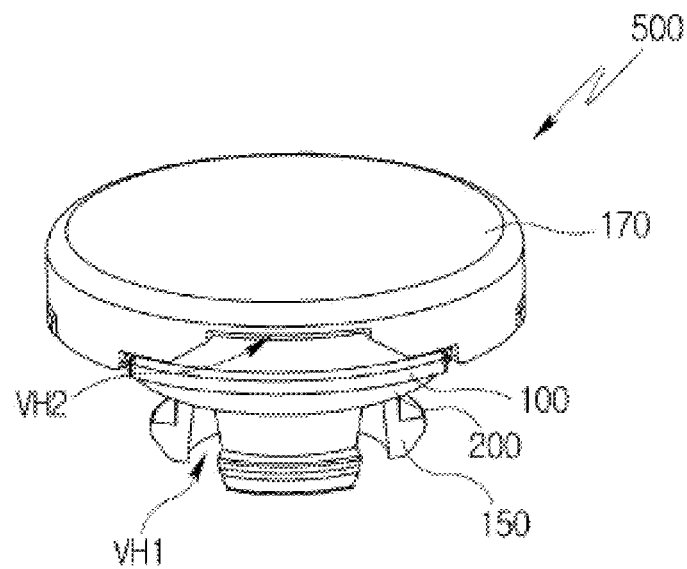
[FIG. 3]
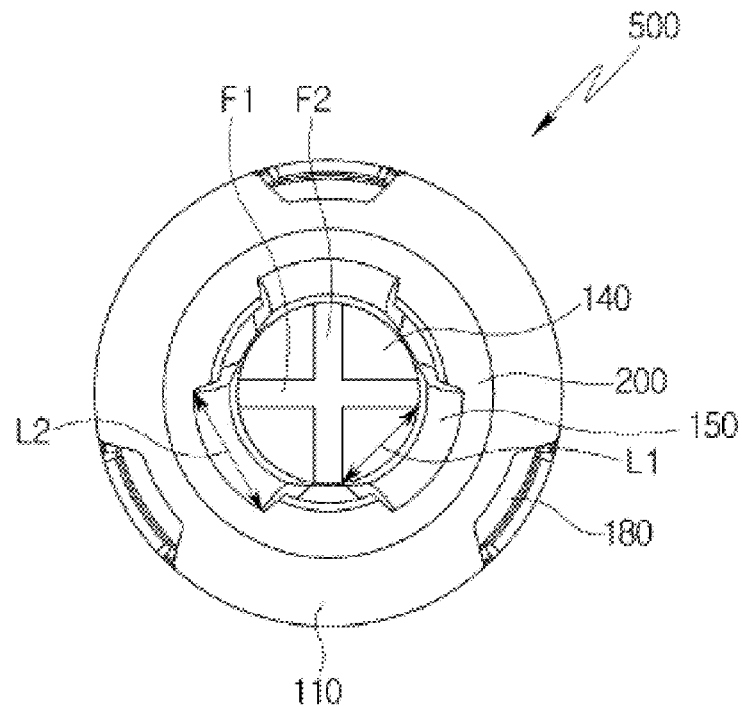

[FIG. 4]
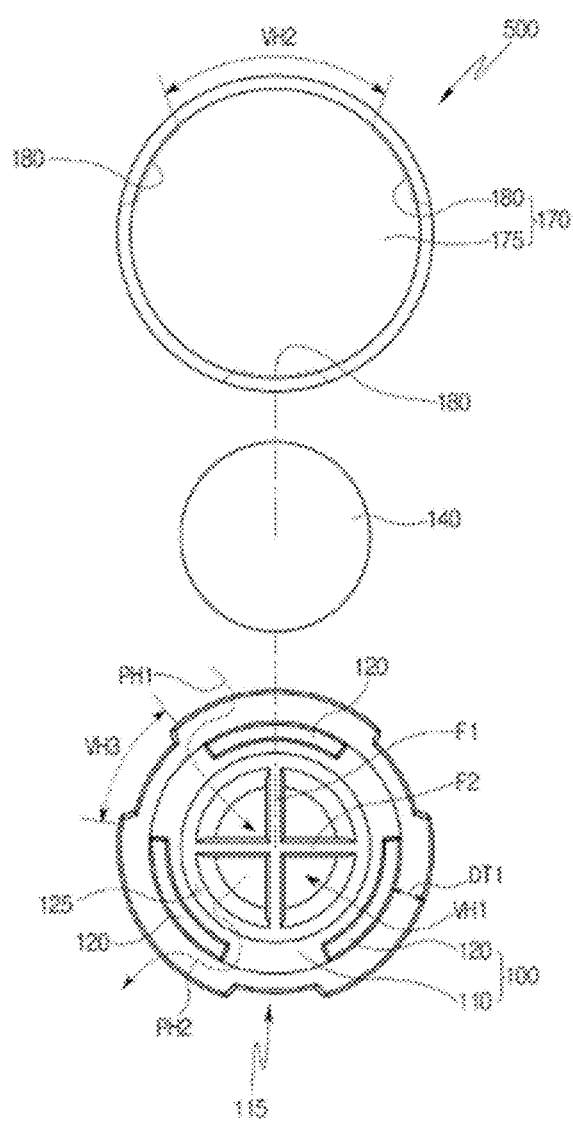

[FIG. 5]
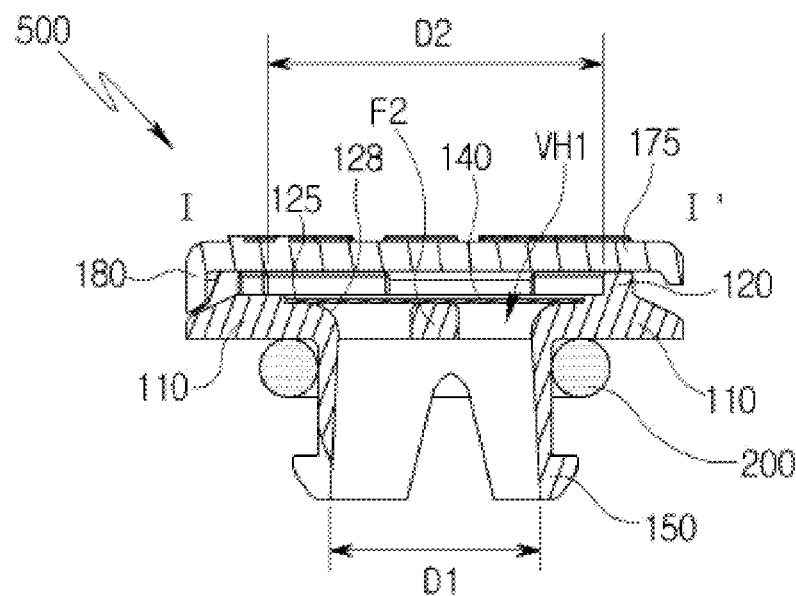
[FIG. 6]
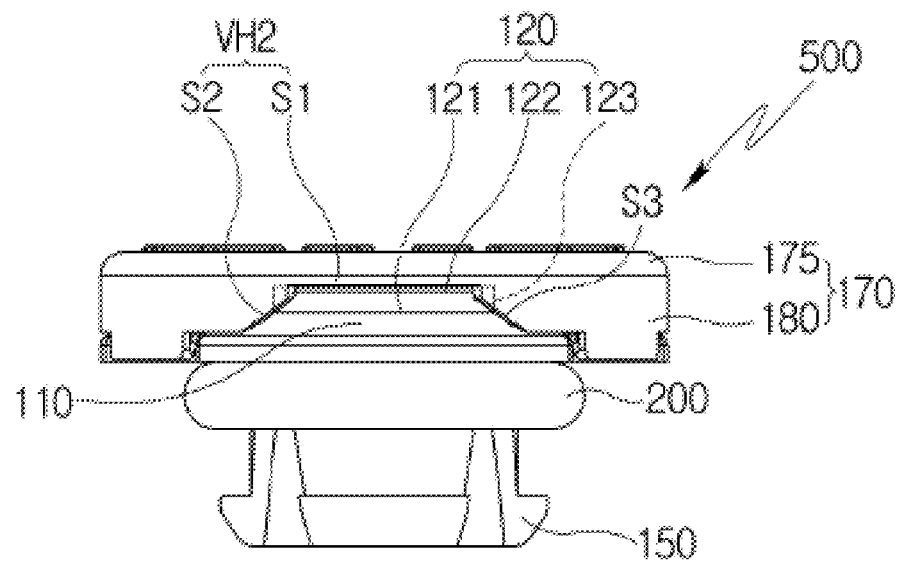

[FIG. 7]
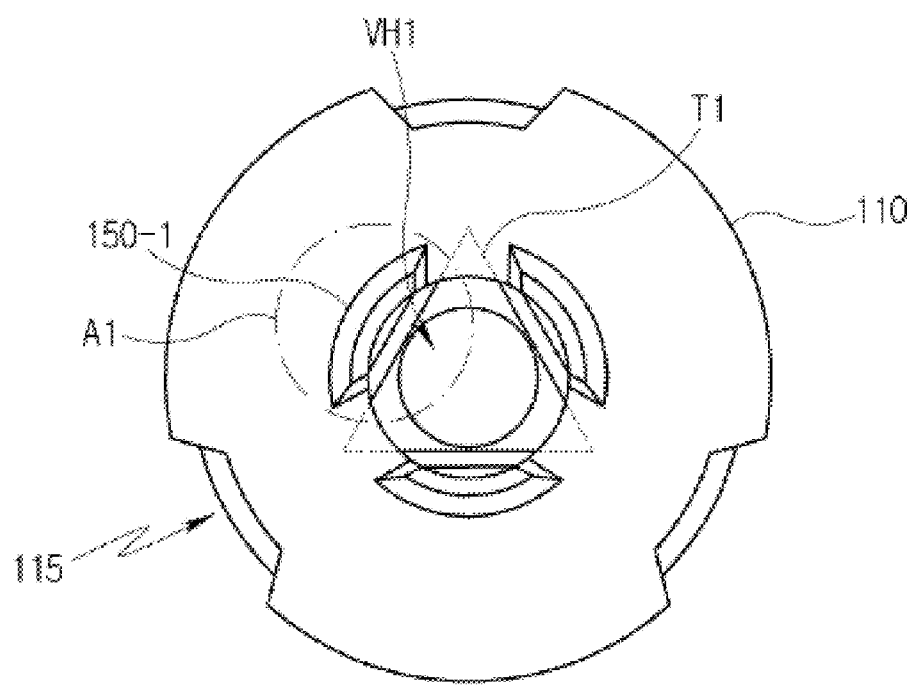

[FIG. 8]
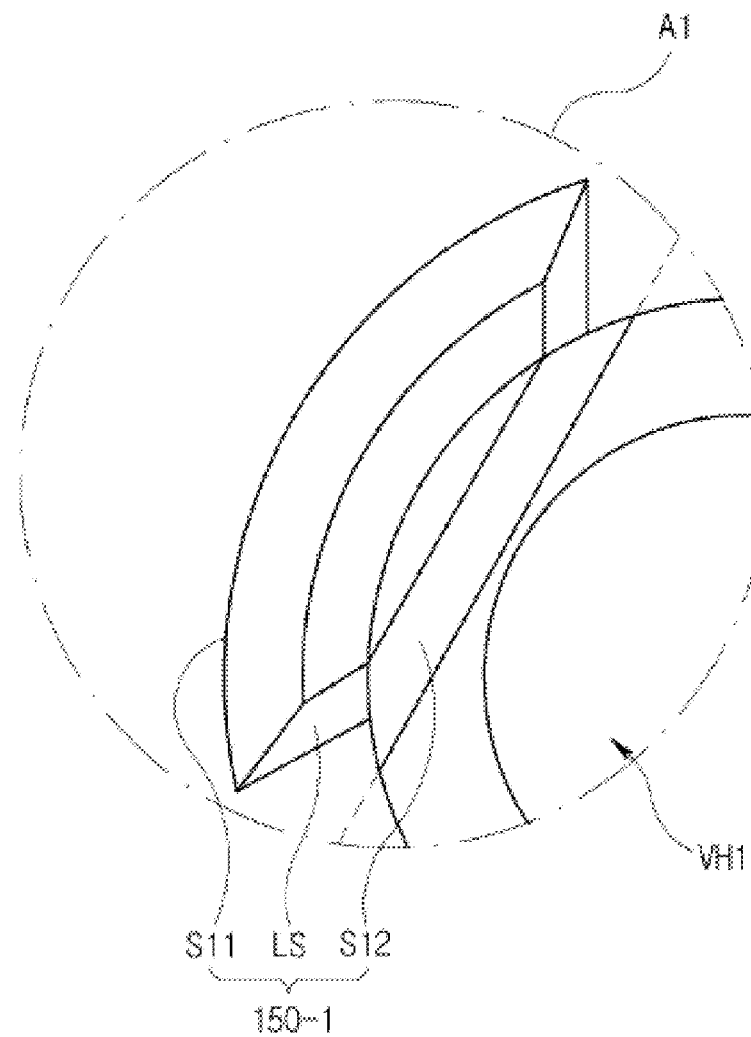

VENTILATION CAP

TECHNICAL FIELD

The present disclosure relates to a ventilation cap, and more particularly, to a ventilation cap which is coupled to a hole of a housing instead of a general cap to enable ventilation between the inside of the housing and the outside of the housing.

BACKGROUND ART

Generally, a headlamp for a vehicle is composed of a combination of a bulb, a lens, and a reflector installed inside the housing. When the headlamp is operated, the inside air of the housing is heated by the heat emitted from the bulb to increase a temperature. In this case, since the outside of the headlamp is relatively lower in temperature than the inside thereof, moisture may be condensed on the surface of the lens by a difference between the internal temperature and the external temperature of the headlamp to generate moisture.

In order to solve such a problem, a vent hole is formed in the headlamp to discharge the heated internal air within the headlamp due to the heating of the bulb to the outside through the vent hole, so that the problem in that the moisture is generated within the headlamp may be solved. However, if the vent hole is formed within the headlamp, foreign substances may be introduced into the headlamp through the vent hole from the outside, thereby causing a problem in that the inside of the headlamp is contaminated by the foreign substances.

RELATED ART DOCUMENT

Patent Document (Patent Document 1) Korean Patent Application Laid-Open No. 10-2016-0029455

DISCLOSURE

Technical Problem

An object of the present disclosure is to provide a ventilation cap which enables ventilation between the inside air and the outside air of a target housing and may block foreign substances and moisture introduced into the target housing.

Technical Solution

A ventilation cap according to the present disclosure for achieving the aforementioned object of the present disclosure includes: a body, a ventilation filter, a cover member, and legs. The body where a first vent hole defined therein, and the ventilation filter is disposed on the body to cover the first vent hole. The cover member is coupled to the body to cover the ventilation filter, and the legs are formed beneath the body and are spaced apart from each other around the first vent hole. Further, the legs are received in a hole defined in a target housing to be coupled to the target housing, and a second vent hole communicating with the first vent hole is defined in a side portion of the cover member.

In an exemplary embodiment of the present disclosure, the body includes: a support part and blocking projections. The support part supports the rim of the ventilation filter, and the blocking projections are spaced apart from each other along the circumference of the first vent hole and coupled to the upper portion of the support part. The first vent hole is defined in the support part, and a third vent hole communicating with the first vent hole and the second vent hole is defined between two blocking projections adjacent to each other among the blocking projections.

In the exemplary embodiment of the present disclosure, a plurality of second vent holes are provided, and the plurality of second vent holes face the blocking projections and have a one-to-one correspondence with the blocking projections.

In the exemplary embodiment of the present disclosure, each of the blocking projections is spaced in a direction from the rim of the support part toward the inside of the support part. Further, a portion of the blocking projection corresponding to the second vent hole among the blocking projections is exposed to the outside by the second vent hole when viewed from the front of the second vent hole.

In the exemplary embodiment of the present disclosure, when viewed from the front of the second vent hole, the second vent hole is defined in a tapered shape having a hypotenuse and an opened width of the second vent hole is increased toward the legs. Further, when viewed from the front of the second vent hole, the hypotenuse of the second vent hole intersects with a side in contact with the support part of the corresponding blocking projection among the blocking projections.

In the exemplary embodiment of the present disclosure, the cover member includes: a ceiling part and a coupling part. Further, the coupling part extends from the rim of the ceiling part toward the legs and is coupled to the support part.

In the exemplary embodiment of the present disclosure, a plurality of coupling parts are provided to be spaced apart from each other. Further, the second vent hole is defined between two coupling parts adjacent to each other among the plurality of coupling parts.

In the exemplary embodiment of the present disclosure, each of the coupling part and the third vent hole is provided in plural, and the plurality of coupling parts face the plurality of third vent holes and have a one-to-one correspondence with the plurality of third vent holes.

In the exemplary embodiment of the present disclosure, a seating groove receiving the rim of the ventilation filter is defined in the support part.

In the exemplary embodiment of the present disclosure, the body further includes: a first support frame. The first support frame is connected to the seating groove to support the ventilation filter, and the first support frame traverses the first vent hole.

In the exemplary embodiment of the present disclosure, the body further includes: a second support frame connected to the seating groove and the first support frame to support the ventilation filter. The second support frame traverses the first vent hole, and the second support frame intersects with the first support frame.

In the exemplary embodiment of the present disclosure, the maximum width of each of the legs is larger than the maximum separation distance between the first support frame and the second support frame when viewed from the floor.

In the exemplary embodiment of the present disclosure, the ventilation cap further includes: an O-ring disposed under the body and fitted into the legs.

In the exemplary embodiment of the present disclosure, the diameter of the first vent hole is larger than the diameter of the first vent hole adjacent to the legs. Further, a line defining the first vent hole has a rounded shape when viewed from a cross section.

In the exemplary embodiment of the present disclosure, each of the legs includes: an outer circumferential surface having a circular shape; and an inner circumferential surface having a planar shape.

In the exemplary embodiment of the present disclosure, each of the legs further includes: a connection surface connecting the outer circumferential surface to the inner circumferential surface. A portion where the connection surface and the inner circumferential surface are connected has an angular shape, and the connection surface is a single surface directly connecting the outer circumferential surface to the inner circumferential surface.

Advantageous Effects

According to the exemplary embodiment of the present disclosure, the ventilation cap is designed so that the air introduced into the ventilation cap bypasses the blocking projections. Accordingly, the ventilation may be allowed between the inside air of the container and the outside air of the container by the ventilation cap, but the moisture or the foreign substances introduced into the ventilation cap may be blocked by the blocking projections or filtered by the ventilation filter.

According to the exemplary embodiment of the present disclosure, the blocking projections of the ventilation cap are provided on the body rather than the cover member. Accordingly, the ventilation filter may be prevented from being damaged by the blocking projections in the fastening process between the body and the cover member of the ventilation cap.

According to the exemplary embodiment of the present disclosure, the maximum separation distance between the first support frame and the second support frame of the body may be smaller than the maximum width of the leg when viewed from the floor. Accordingly, even if the plurality of ventilation caps are laminated in the process of manufacturing the ventilation cap, the ventilation filter may be prevented from being damaged by the legs penetrating between the first lead frame and the second lead frame.

According to the exemplary embodiment of the present disclosure, the line defining the first vent hole of the body may have a rounded shape when viewed from the cross section, and the diameter of the first vent hole may be increased toward the ventilation filter. Accordingly, as described above, even if the diameter of the first vent hole is variably designed, it is possible to secure the strength of the first vent hole using the design of the cross-sectional shape of the first vent hole, and at the same time, to increase the flow rate of the air passing through the first vent hole.

According to the exemplary embodiment of the present disclosure, the inner circumferential surface of each of the legs may be provided to have the single surface having the planar shape. Further, the connection surface connecting the outer circumferential surface of each of the legs to the inner circumferential surface thereof may be provided to have the single surface directly connecting the outer circumferential surface to the inner circumferential surface. Accordingly, there occurs the effect in which the stresses applied to the legs are distributed in the process of inserting the legs into the hole of the target housing, thereby improving durability of the legs against the stresses.

According to the exemplary embodiment of the present disclosure, the blocking projection may be designed so that a portion of the second vent hole defined in the cover member is covered by the blocking projection of the body when viewed from the front of the second vent hole, thereby primarily blocking the foreign substances introduced through the second vent hole by the blocking projection. Further, the second vent hole may be defined to have a tapered shape, thereby increasing the opened width of the second vent hole to increase the flow rate of the air introduced into the ventilation cap or discharged outward from the ventilation cap through the second vent hole.

DESCRIPTION OF DRAWINGS

FIG. 1 is an exploded perspective diagram illustrating a ventilation cap according to an exemplary embodiment of the present disclosure.

FIG. 2 is a perspective diagram illustrating the ventilation cap illustrated in FIG. 1.

FIG. 3 is a plan diagram illustrating the bottom surface of the ventilation cap illustrated in FIG. 2.

FIG. 4 is a plan diagram illustrating a coupling relationship between a body, a ventilation filter, and a cover member illustrated in FIG. 1.

FIG. 5 is a cross-sectional diagram illustrating a surface taken along the line illustrated in FIG. 1.

FIG. 6 is a side diagram when viewed from the front of a second vent hole of the ventilation cap illustrated in FIG. 1.

FIG. 7 is a plan diagram illustrating the bottom surface of a body and legs according to another exemplary embodiment of the present disclosure.

FIG. 8 is a partially enlarged diagram enlarging and illustrating a first region illustrated in FIG. 7.

MODE FOR INVENTION

Hereinafter, exemplary embodiments of the present disclosure will be described in detail with reference to the accompanying drawings. The objects, features, and effects of the present disclosure described above may be understood through the exemplary embodiments related to the drawings. However, the present disclosure is not limited to the exemplary embodiments described herein, and may be applied and modified in various forms. Rather, the exemplary embodiments of the present disclosure to be described later are provided to more clarify the technical spirit disclosed by the present disclosure, and further to sufficiently convey the technical spirit of the present disclosure to those skilled in the art to which the present disclosure pertains. Accordingly, the scope of the present disclosure should not be construed as being limited by the exemplary embodiments to be described later. Meanwhile, the same reference numerals in the following exemplary embodiments and drawings denote the same components.

Further, terms such as 'first', 'second', and the like in the present specification are used for the purpose of distinguishing one component from other components rather than the limited meaning. Further, when a part such as a film, a region, or a component is said to be "above" or "on" another part, not only a case where the part is directly above another part, but also a case where other films, regions, components, or the like are interposed therebetween are included.

Referring to FIGS. 1, 2, and 3, a ventilation cap 500 is coupled to a hole 305 of a target housing 300 to enable ventilation between the inside of the target housing 300 and the outside of the target housing 300. In this exemplary embodiment, the target housing 300 may be used for storing a headlamp for a vehicle.

In another exemplary embodiment, the ventilation cap 500 may also be fastened to a hole defined in the housing of a device having a different purpose. For example, the ventilation cap 500 is fastened to a hole defined in a housing for a lighting device storing components of the lighting device, and the ventilation cap 500 also enables ventilation between the inside and outside of the housing for the lighting device.

In this exemplary embodiment, the ventilation cap 500 includes a body 100, a ventilation filter 140, a cover member 170, legs 150, and an O-ring 200.

The body 100 stores the ventilation filter 140, and the body 100 as a first vent hole VH1 defined therein communicating with a hole 305 of the target housing 300. In this exemplary embodiment, the body 100 includes a support part 110, blocking projections 120, a first support frame F1, and a second support frame F2.

The first vent hole VH1 is defined in the support part 110. More specifically, when viewed from the floor, the first vent hole VH1 may be approximately defined in the center of the support part 110 in a closed loop shape. Further, the first vent hole VH1 overlaps the hole 305 of the target housing 300. Accordingly, the inside of the ventilation cap 500 may be ventilated with the inside of the target housing 300 through the first vent hole VH1 and the hole 305.

Further, a seating groove 125 in which the ventilation filter 140 is seated is defined in the support part 110. In this exemplary embodiment, the support part 110 is removed to one depth along the circumference of the first vent hole VH1 outside the first vent hole VH1 to define a seating groove 125. Accordingly, a stepped portion is formed on the upper surface of the support part 110 by the seating groove 125, and the rim of the ventilation filter 140 is received in the seating groove 125 to prevent the ventilation filter 140 from moving.

The blocking projections 120 are disposed on the support part 110, and the blocking projections 120 are disposed to be spaced apart from each other along the circumference of the first vent hole VH1. The blocking projections 120 are coupled to the upper portion of the support part 110 and fixed to the support part 110. In this exemplary embodiment, each of the blocking projections 120 may be defined by protruding one height from the support part 110 outside the seating groove 125. According to the blocking projections 120 having the aforementioned structure, each of the blocking projections 120 may block foreign substances introduced into the ventilation cap from the outside of the ventilation cap 50.

Unlike the exemplary embodiment of the present disclosure, if the blocking projections 120 for preventing the foreign substances from being introduced are provided to the cover member 170, when the cover member 170 is coupled to the body 100, the blocking projections 120 may press the ventilation filter 140, thereby damaging the ventilation filter 140. However, as described above, in the exemplary embodiment of the present disclosure, since the blocking projections 120 are provided on the support part 110 of the body 100, the ventilation filter 140 may be prevented from being damaged by the blocking projections 120 in the fastening process between the body 100 and the cover member 170.

Since the blocking projections 120 are spaced apart from each other, a third vent hole VH3 may be defined between two blocking projections 120 adjacent to each other among the blocking projections 120. Since the third vent hole VH3 is connected to the inside of the ventilation cap, the third vent hole VH3 may communicate with the first vent hole VH1 and the hole 305 of the target housing 300.

A first support frame F1 and a second support frame F2 are connected to the seating groove 125 to support the ventilation filter 140. Each of the first support frame F1 and the second support frame F2 crosses over the first vent hole VH1, and the first support frame F1 and the second support frame F2 extend in different directions, so that the first support frame F1 intersects with the second support frame F2. Accordingly, the rim of the ventilation filter 140 is supported by the seating groove 125, and the inner portion of the ventilation filter 140 is partially supported by the first support frame F1 and the second support frame F2.

According to the aforementioned structure of the first support frame F1 and the second support frame F2, even if the weight of the ventilation filter 140 is increased by the moisture provided from the outside of the ventilation cap 500 or the moisture provided from the inside of the target housing 300, the ventilation filter 140 may be prevented from sagging downward by the first support frame F1 and the second support frame F2.

In this exemplary embodiment, the body 100 includes the first support frame F1 and the second support frame F2, but in another exemplary embodiment, the body 100 may also include more support frames in addition to the first support frame F1 and the second support frame F2. In still another exemplary embodiment, the body 100 may also include any one of the first support frame F1 and the second support frame F2.

Further, in this exemplary embodiment, each of the first support frame F1 and the second support frame F2 extends in one direction, but in another exemplary embodiment, each of the first support frame F1 and the second support frame F2 may extend in a curved shape, or also extend in multiple directions, such as a zigzag shape.

Meanwhile, if the maximum separation distance L1 between the first support frame F1 and the second support frame F2 is defined when viewed from the floor, and the maximum width L2 of each of the legs 150 is defined when viewed from the floor, the maximum width L2 may be larger than the maximum separation distance L1 in this exemplary embodiment. Accordingly, when a plurality of ventilation caps 500 are laminated in the process of manufacturing the ventilation cap 500, the legs 150 may penetrate between the first lead frame F1 and the second lead frame F2 to prevent the ventilation filter 140 from being damaged.

The ventilation filter 140 is disposed on the seating groove 125 of the body 100, the first lead frame F1, and the second lead frame F2. In this exemplary embodiment, the constituent material of the ventilation filter 140 may include a polymer material, and a plurality of pores through which air passes may be dispersed in the ventilation filter 140. Accordingly, the ventilation filter 140 may allow air to pass through, and instead, the ventilation filter 140 may absorb or block moisture or foreign substances.

As in this exemplary embodiment, if the target housing 300 is used for storing the components such as a bulb of a headlamp for a vehicle, moisture or foreign substances may be prevented from being introduced into the target housing 300 by the ventilation filter 140, in the process in which the outside air of the ventilation cap 500 is introduced into the target housing 300 through the ventilation filter 140 and the inside of the target housing 300 is air-cooled.

In this exemplary embodiment, the constituent material of the ventilation filter 140 may include polyethylene terephthalate (PET), polypropylene (PP), polyethylene (PE), nylon, or the like, and the ventilation filter 140 may have a structure in which a plurality of pores are formed, such as a nonwoven fabric.

In this exemplary embodiment, the method for manufacturing the ventilation filter 140 may manufacture the ventilation filter 140 through which a plurality of pores are formed by randomly electrospinning the polymer material to form a polymer layer and curing the polymer layer.

In this exemplary embodiment, the polymer material configuring the ventilation filter 140 may be a single material or a mixed material containing any one of polyamide, polyimide, polyamideimide, poly (meth-phenylene isophthalamide), polysulfone, polyether ketone, polyether imide, aromatic polyesters such as polyethylene terephthalate, polytrimethylene terephthalate, and polyethylene naphthalate, polyphosphazenes such as polytetrafluoroethylene, polyphenoxy phosphazene, poly {bis[2-(2-methoxyethoxy) phosphazene]}, polyurethane copolymer including polyurethane and polyether urethane, cellulose acetate, cellulose acetate butyrate, and cellulose acetate propionate.

The cover member 170 is coupled to the body 100 to cover the ventilation filter 140. In this exemplary embodiment, the cover member 170 includes a ceiling part 175 and a plurality of coupling parts 180.

The ceiling part 175 overlaps the support part 110. The ceiling part 175 may be spaced apart from the support part 110 to allow air to pass between the ceiling part 175 and the support part 110. In this exemplary embodiment, the ceiling part 175 may have a shape corresponding to the support part 110 to be flat. Accordingly, as in this exemplary embodiment, if the support part 110 has a substantially circular shape when viewed from the floor, the ceiling part 175 may have a circular flat shape to correspond to the shape of the support part 110.

A second vent hole VH2 is defined in the side portion of the cover member 170. More specifically, the second vent hole VH2 is defined between two coupling parts adjacent to each other among the plurality of coupling parts 180. The second vent hole VH2 is located outside the ventilation cap 500 farther than a third vent hole VH3.

In this exemplary embodiment, a hole penetrating the ceiling part 175 may not be formed in the ceiling part 175. Unlike the exemplary embodiment of the present disclosure, if a through hole is formed in the ceiling part 175, the effect in which external moisture is directly introduced into the ventilation filter 140 side through the through hole of the ceiling part 175, and the external moisture is filtered by the ventilation filter 140 may be reduced. However, in the exemplary embodiment of the present disclosure, since the through hole is not formed in the ceiling part 175, external moisture is prevented from being directly introduced into the ventilation filter 140 side through the ceiling part 175, so that the function in which the ventilation filter 140 filters moisture may be easily maintained.

The plurality of coupling parts 180 extend from the rim of the ceiling part 175 toward the legs 150 and are coupled with the support part 110. In this exemplary embodiment, the plurality of coupling parts 180 are spaced apart from each other and coupled with the rim of the ceiling part 175, and each of the plurality of coupling parts 180 may substantially extend vertically from the ceiling part 175.

The legs 150 are spaced apart from each other around the first vent hole VH1 and formed on the lower end of the support part 110, and each of the legs 150 extends in a direction away from the support part 110. The legs 150 are inserted into the hole 305 of the target housing 300 and fastened with the target housing 300, so that the ventilation cap 500 may be fixed to the hole 305 of the target housing 300. In this exemplary embodiment, a hook is provided outside each of the legs 150, so that the legs 150 may be coupled to the hole 305 of the target housing 300 in a hook structure.

The O-ring 200 is fitted into the legs 150 and disposed under the support part 110. In this exemplary embodiment, the O-ring 200 may include a material having elasticity, such as rubber. Further, in a state where the ventilation cap 500 is coupled to the target housing 300, the O-ring 200 is interposed between the legs 150 and the target housing 300. Accordingly, the O-ring 200 reduces a gap between the ventilation cap 500 and the target housing 300, and the O-ring 200 allows the fastening force between the ventilation cap 500 and the target housing 300 to be further strengthened.

Referring to FIGS. 4 and 5, the plurality of coupling parts 180 of the cover member 170 are coupled to have a one-to-one correspondence with a plurality of coupling grooves 115 defined by partially removing the rim of the support part 110. In this exemplary embodiment, a hook is provided inside each of the plurality of coupling parts 180, so that the plurality of coupling parts 180 may be coupled to have a one-to-one correspondence with the plurality of coupling grooves 115 in a hook structure.

As described above, a plurality of second vent holes VH2 are defined in the cover member 170, and each of the plurality of second vent holes VH2 is defined between two coupling parts adjacent to each other among the plurality of coupling parts 180. Further, a plurality of third vent holes VH3 are disposed in the support part 110, and each of the plurality of third vent holes VH3 is defined between two blocking projections adjacent to each other among the plurality of blocking projections 120.

In this exemplary embodiment, the plurality of second vent holes VH2 face the plurality of blocking projections 120 and have a one-to-one correspondence with the plurality of blocking projections 120. Accordingly, the foreign substances introduced into the ventilation cap 500 through the plurality of second vent holes VH2 may be primarily blocked by the plurality of blocking projections 120.

Further, each of the plurality of blocking projections 120 is located between the rim of the support part 110 and the first vent hole VH1. More specifically, each of the plurality of blocking projections 120 is spaced by a separation distance DT1 in a direction from the edge of the support part 110 toward the inside of the support part 110. Accordingly, when viewed from the floor, air may pass between each of the plurality of blocking projections 120 and the rim of the support part 110.

Meanwhile, the plurality of blocking projections 120 and the plurality of coupling parts 180 may serve as a partition wall defining an air passage by blocking the gap between the ceiling part 175 and the support part 120. Accordingly, the air introduced into the ventilation cap 500 moves along the air passage defined by the plurality of blocking projections 120 and the plurality of coupling parts 180.

More specifically, the air provided from the outside of the ventilation cap 500 may be introduced into the hole (305 in FIG. 1) of the target housing (300 in FIG. 1) along a first path PH1 sequentially passing through the second vent hole VH2, the third vent hole VH3, the ventilation filter 140, and the first vent hole VH1. Further, as opposed to the first path PH1, the air provided from the inside of the target housing (300 in FIG. 1) may be discharged to the outside of the ventilation cap 500 along a second path PH2 sequentially passing through the first vent hole VH1, the ventilation filter 140, the third vent hole VH3, and the second vent hole VH2.

According to the first path PH1, the foreign substances provided from the outside of the ventilation cap 500 is blocked by the plurality of blocking projections 120, but the outside air provided from the outside of the ventilation cap 500 may bypass the plurality of blocking projections 120 along the first path PH1 and be introduced into the hole (305 in FIG. 1) side of the target housing (300 in FIG. 1). Accordingly, the inside of the target housing (300 of FIG. 1) may be air-cooled by the outside air, and at the same time, the moisture and foreign substances provided from the outside may be filtered by the ventilation filter 140.

According to the second path PH2, the inside air of the target housing (300 in FIG. 1) may bypass the plurality of blocking projections 120 along the second path PH2 and be discharged to the outside of the ventilation cap 500. If the inside air is heated, the inside air is discharged to the outside through the ventilation cap 500, so that the effect in which the inside of the target housing (300 in FIG. 1) is air-cooled may occur.

Meanwhile, in this exemplary embodiment, the diameter of the first vent hole VH1 may be increased as it approaches the ventilation filter 140. More specifically, the first vent hole VH1 has a first diameter D1 adjacent to the leg 150 and a second diameter D2 adjacent to the ventilation filter 140, and the second diameter D2 may be larger than the first diameter D1. According to the above, even if the diameter of the hole (305 in FIG. 1) of the target housing (300 in FIG. 1) is preset and it is not easy to increase the size of the first diameter D1, the second diameter D2 of the ventilation filter 140 is increased and thus the flow rate of the air passing through the first vent hole VH1 may be increased.

Further, in this exemplary embodiment, when viewed from a cross section, a line 128 defining the first vent hole VH1 may have a rounded shape. Accordingly, as described above, even if the first diameter D1 of the first vent hole VH1 is variably designed, the line 128 defining the first vent hole VH1 may be designed in a rounded shape, thereby improving durability of the first vent hole VH1 by external stress.

FIG. 6 is a side diagram illustrating the ventilation cap 500 when viewed from the front of the second vent hole VH2. As described with reference to FIG. 4, since the second vent hole VH2 faces the blocking projection 120, the second vent hole VH2 is covered by the blocking projection 120, that is, the blocking projection 120 is exposed to the outside by the second vent hole VH2.

In this exemplary embodiment, the second vent hole may be defined as a horizontal side S1, a first hypotenuse S2, and a second hypotenuse S3. The horizontal side S1 is horizontal to the ceiling part 175, and the first hypotenuse S2 is obliquely connected to one end of the horizontal side S1. Further, the second hypotenuse S3 is obliquely connected to the other end of the horizontal side S1, and the second hypotenuse S3 extends away from the first hypotenuse S2 as it approaches the legs 150. Accordingly, the opened width of the second vent hole VH2 increases as it is closer to the legs 150, and the second vent hole VH2 may have a tapered shape.

In this exemplary embodiment, when viewed from the front of the second vent hole, the blocking projection may have a rectangular shape, and the blocking projection 120 may include a first long side 121, a second long side 122, and a short side 123 connecting the first long side 121 to the second long side 122. The first long side 121 may be defined as a surface in contact with the support part 110 of the blocking projection 120, and the second long side 122 is defined as the upper surface of the blocking projection 120.

Further, the short side 123 connects one end of the first long side 121 to one end of the second long side 122.

In this exemplary embodiment, each of the first hypotenuse S2 and the second hypotenuse S3 intersects with the first long side 121. Unlike this exemplary embodiment, if the first hypotenuse S2 and the second hypotenuse S3 do not intersect with the first long side 121, when viewed from the front of the second vent hole VH2, a gap between each of the first hypotenuse S2 and the second hypotenuse S3 and the first long side 121 is generated, so that the foreign substances introduced through the second vent hole VH2 may be introduced through the gap. However, in the aforementioned exemplary embodiment of the present disclosure, since the first hypotenuse S2 and the second hypotenuse S3 intersect with the first long side 121, a portion of the second vent hole VH2 may be substantially covered by the blocking projection 120 when viewed from the front of the second vent hole VH2, thereby reducing the amount of external foreign substances or moisture introduced through the second vent hole VH2.

FIGS. 7 and 8 are bottom diagrams illustrating a support part 110 and legs 150-1 according to another exemplary embodiment of the present disclosure. Since the support part 110 illustrated in FIGS. 7 and 8 has the same structure as the support (100 in FIG. 1) described with reference to FIG. 1, overlapping descriptions of the support part 110 are omitted. Further, the structures of the support part 110 and the legs 150-1 illustrated in FIGS. 7 and 8 replace the support part (100 in FIG. 1) and the legs (150 in FIG. 1) described with reference to FIG. 1 and are coupled to the cover member (170 in FIG. 1) and the ventilation filter (140 in FIG. 1), thereby implementing the ventilation cap.

The legs 150-1 are fixed to the bottom surface of the support part 110. The legs 150-1 may also be integrally formed with the support part 110, and the legs 150-1 are different members from the support part 110, and the legs 150-1 may also be fixed to the support part 110 by a separate component such as a screw.

As an example, one leg 150-1 among the legs 150-1 enlarged and illustrated in FIG. 8 is described as follows.

In this exemplary embodiment, the leg 150-1 includes an outer circumferential surface S11, an inner circumferential surface S12 and a connection surface LS. The outer circumferential surface S11 is the outer surface of the leg 150-1, and the outer circumferential surface S11 may have a shape with a curved surface. In this exemplary embodiment, the outer circumferential surface S11 has the same center of the circle as the first vent hole VH1 and may have an arc shape defined on the circumference located outside the first vent hole.

The inner circumferential surface S12 is the inner surface of the leg 150-1, and the inner circumferential surface S12 has a planar shape. In this exemplary embodiment, the inner circumferential surface S12 of the leg 150-1 may be defined as a single surface.

Further, if a virtual equilateral triangle T1 is defined outside the first vent hole VH1 with respect to the center of the first vent hole VH1 when viewed from the floor, the inner circumferential surface S12 may be located on one side of the equilateral triangle T1. Further, the inner circumferential surfaces of other legs adjacent to the leg 150-1 may be located to have a one-to-one correspondence on another side of the equilateral triangle T1.

The connection surface LS connects the outer circumferential surface S11 to the inner circumferential surface S12. In this exemplary embodiment, the connection surface LS is a single surface which directly connects the outer circumferential surface S11 to the inner circumferential surface S12, and a portion where the connection surface LS and the inner circumferential surface S12 are connected to each other has an angular shape.

According to the legs 150-1 each having the aforementioned structure, when stress is applied to the inner circumferential surface S12 side of the legs 150-1 in the process of inserting the legs 150-1 into the hole (305 in FIG. 1) of the target housing (300 in FIG. 1), the inner circumferential surface S12 of the legs 150-1 are located on the equilateral triangle T1 sides, so that the stress may be evenly dispersed on the legs, thereby improving durability of the legs 150-1 against the stress. Accordingly, in the process of assembling the legs 150-1 to the target housing (300 in FIG. 1), the phenomenon in which the insides of the legs 150-1 are damaged or the shapes are deformed may be reduced.

Further, if the stress is transferred to the outer circumferential surface S12 side of the legs 150-1, the effect of dispersing the stress may be generated through the outer circumferential surface S12 having an arc shape. Accordingly, in the process of assembling the legs 150-1 to the target housing (300 in FIG. 1), the phenomenon in which the outsides of the legs 150-1 are damaged or the shapes are deformed may be reduced.

Although the present disclosure has been described with reference to the above exemplary embodiments, those skilled in the art may understand that the present disclosure may be variously modified and changed without departing from the spirit and scope of the present disclosure described in the scope of the appended claims.

The invention claimed is:

1. A ventilation cap comprising:
 a body where a first vent hole is defined therein;
 a ventilation filter disposed on the body to cover the first vent hole;
 a cover member coupled to the body to cover the ventilation filter; and
 legs spaced apart from each other around the first vent hole and formed under the body,
 wherein the legs are received in a hole defined in a target housing to be coupled to the target housing, and a second vent hole communicating with the first vent hole is defined in a side of the cover member,
 wherein the body is a support body that includes a seating groove formed along a circumference of the first vent hole,
 wherein the body further includes:
 a first support frame connected to the seating groove and crossing over the first vent hole, and
 a second support frame connected to the seating groove and crossing over the first vent hole,
 wherein the first support frame and the second support frame traverse the first vent hole,
 wherein the second support frame intersects with the first support frame, and
 wherein a maximum width of each of the legs is larger than a maximum separation distance between the first support frame and the second support frame when viewed from a floor.

2. The ventilation cap of claim 1,
 wherein the body comprises:
 blocking projections spaced apart from each other along the circumference of the first vent hole and coupled to an upper portion of a support part of the support body, and
 wherein the first vent hole is defined in the support part, and a third vent hole communicating with the first vent hole and the second vent hole is defined between two blocking projections adjacent to each other among the blocking projections.

3. The ventilation cap of claim 2,
 wherein a plurality of second vent holes are provided, and the plurality of second vent holes face the blocking projections and have a one-to-one correspondence with the blocking projections.

4. The ventilation cap of claim 2,
 wherein each of the blocking projections is spaced in a direction from a rim of the support part toward an inside of the support part, and a portion of the blocking projection corresponding to the second vent hole among the blocking projections is exposed to an outside by the second vent hole when viewed from a front of the second vent hole.

5. The ventilation cap of claim 4,
 wherein when viewed from the front of the second vent hole, the second vent hole is defined in a tapered shape having a hypotenuse and an opened width of the second vent hole is increased toward the legs.

6. The ventilation cap of claim 2,
 wherein the cover member comprises:
 a ceiling part; and
 a coupling part extending from rim of the ceiling part toward the legs and coupled to the support part.

7. The ventilation cap of claim 6,
 wherein a plurality of coupling parts are provided to be spaced apart from each other, and the second vent hole is defined between two coupling parts adjacent to each other among the plurality of coupling parts.

8. The ventilation cap of claim 6,
 wherein each of the coupling part and the third vent hole is provided in plural, and the plurality of coupling parts face the plurality of third vent holes and have a one-to-one correspondence with the plurality of third vent holes.

9. The ventilation cap of claim 6,
 wherein the ceiling part is flat, and a hole penetrating the cover member is not defined in the ceiling part.

10. The ventilation cap of claim 1, further comprising: an O-ring disposed under the body and fitted into the legs.

11. The ventilation cap of claim 2,
 wherein the diameter of the first vent hole increases toward the ventilation filter, and a line defining the first vent hole has a rounded shape when viewed from a cross section.

12. The ventilation cap of claim 1,
 wherein each of the legs comprises:
 an outer circumferential surface having a circular shape; and
 an inner circumferential surface having a planar shape.

13. The ventilation cap of claim 12,
 wherein each of the legs further comprises: a connection surface connecting the outer circumferential surface to the inner circumferential surface, and
 wherein a portion where the connection surface and the inner circumferential surface are connected has an angular shape, and the connection surface is a single surface directly connecting the outer circumferential surface to the inner circumferential surface.

\* \* \* \* \*